(12) United States Patent
Yu et al.

(10) Patent No.: US 8,749,043 B2
(45) Date of Patent: Jun. 10, 2014

(54) PACKAGE ON PACKAGE STRUCTURE

(75) Inventors: Chen-Hua Yu, Hsin-Chu (TW);
Mirng-Ji Lii, Sinpu Township (TW);
Hao-Yi Tsai, Hsin-Chu (TW);
Hsien-Wei Chen, Sinying (TW);
Kai-Chiang Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 117 days.

(21) Appl. No.: 13/409,756

(22) Filed: Mar. 1, 2012

(65) Prior Publication Data

US 2013/0228932 A1    Sep. 5, 2013

(51) Int. Cl.
*H01L 23/02* (2006.01)
*H01L 21/16* (2006.01)

(52) U.S. Cl.
USPC ............ 257/686; 257/685; 257/E25.006; 257/E25.021; 257/E25.027; 257/E23.085; 438/109

(58) Field of Classification Search
USPC .......... 257/685, 686, 777, E25.006, E25.013, 257/E25.021, E25.027, E23.085; 438/109, 438/FOR. 368, FOR. 426
See application file for complete search history.

(56) References Cited

U.S. PATENT DOCUMENTS

| | | | |
|---|---|---|---|
| 6,756,253 B1 * | 6/2004 | Farnworth et al. | 438/125 |
| 8,253,229 B2 * | 8/2012 | Yamano et al. | 257/686 |
| 2013/0187266 A1 * | 7/2013 | Chen | 257/737 |

* cited by examiner

*Primary Examiner* — Jasmine Clark
(74) *Attorney, Agent, or Firm* — Slater and Matsil, L.L.P.

(57) ABSTRACT

A package on packaging structure comprising a first package and a second package provides for improved thermal conduction and mechanical strength by the introduction of a thermally conductive substrate attached to the second package. The first package has a first substrate and a first integrated circuit. The second package has a second substrate containing through vias that has a first coefficient of thermal expansion. The second package also has a second integrated circuit having a second coefficient of thermal expansion located on the second substrate. The second coefficient of thermal expansion deviates from the first coefficient of thermal expansion by less than about 10 or less than about 5 parts-per-million per degree Celsius. A first set of conductive elements couples the first substrate and the second substrate. A second set of conductive elements couples the second substrate and the second integrated circuit.

20 Claims, 6 Drawing Sheets

6

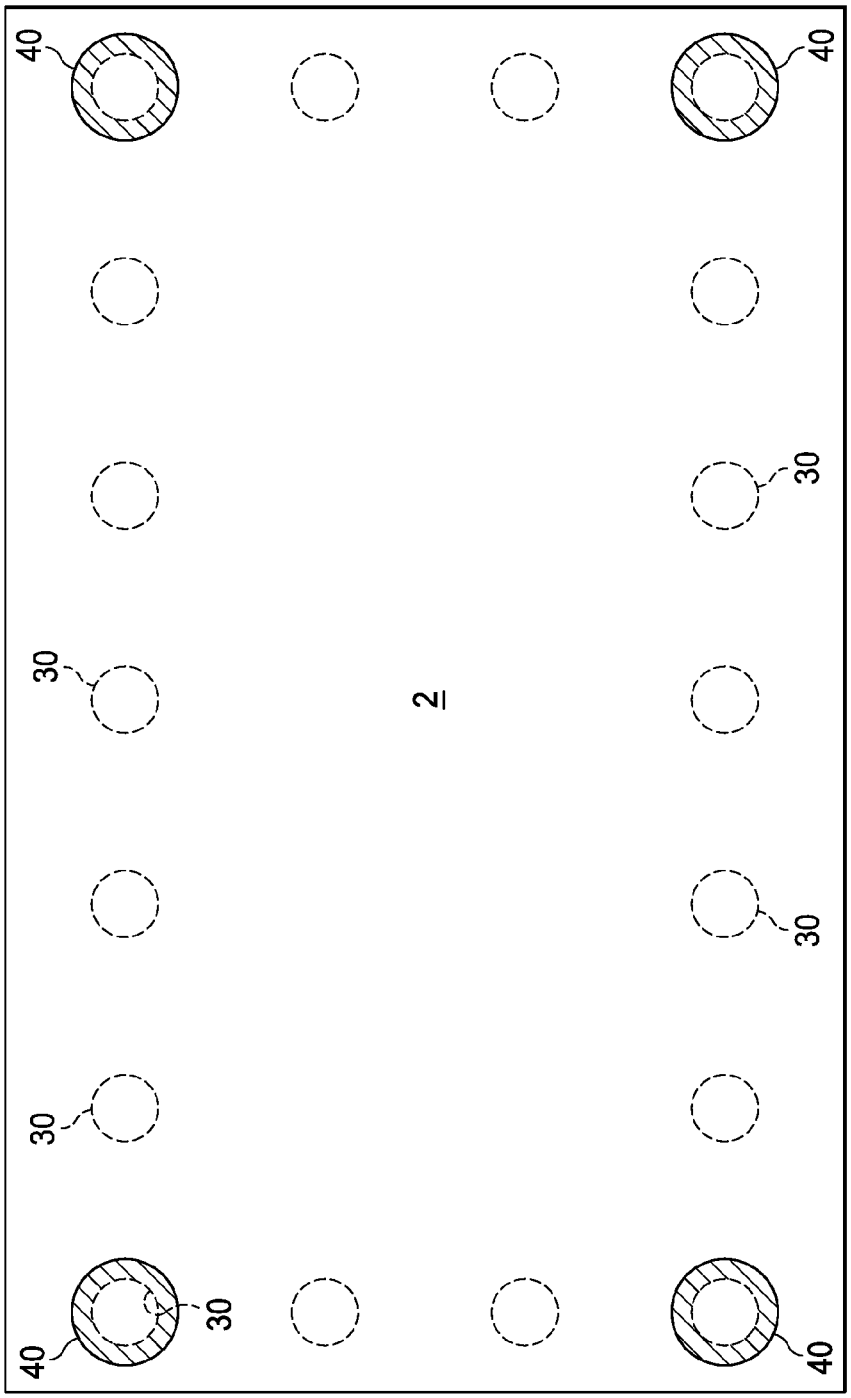

PACKAGE ON PACKAGE STRUCTURE

BACKGROUND

Package on Package (PoP) is becoming an increasingly popular integrated circuit packaging technique because it allows for higher density electronics. Increasing die size in PoP can lead to thermal dissipation inefficiency, warpage induced ball cracking caused by thermal expansion mismatch between the components of the package, and a larger than desired profile package.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 is a top-down view of an illustrative embodiment.

DETAILED DESCRIPTION OF ILLUSTRATIVE EMBODIMENTS

Various embodiments of Package on Package (PoP) structures will be described with reference to FIG. 1. It should be appreciated that the materials, geometries, dimensions, structures, and process parameters described herein are exemplary only, and are not intended to be, and should not be construed to be, limiting to the invention claimed herein.

Figure 1A:
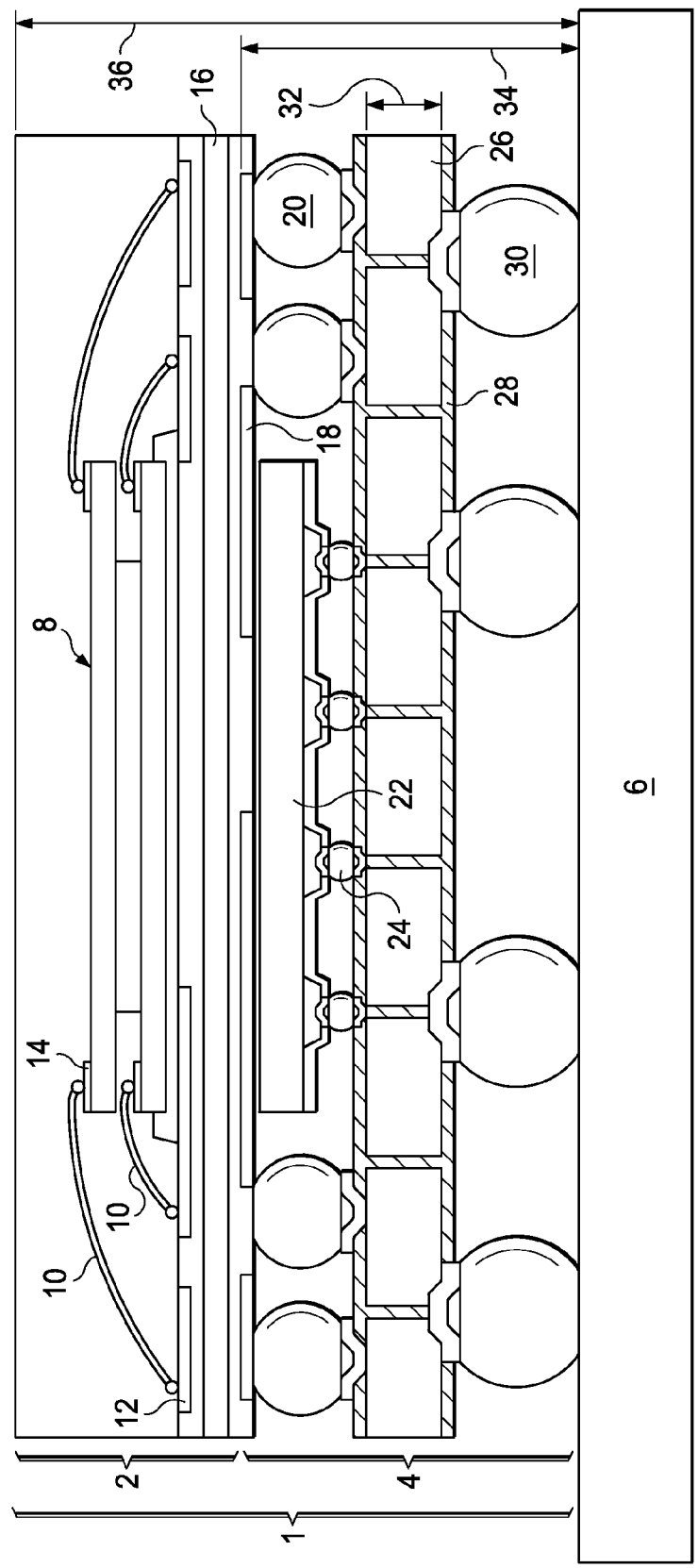
FIGS. 1a through 1e are cross sectional views of embodiment devices.

A first embodiment package will be discussed with reference to FIG. 1a. FIG. 1a illustrates PoP structure 1. PoP structure 1 includes top package 2, which contains a plurality of stacked die 8, which may be wire bonded to top substrate 16 by way of contacts 14 (on respective stacked die 8), bond wires 10, and contacts 12 (on top substrate 16). Individual stacked die may comprise a memory chip, a logic chip, a processor chip, or the like. Although FIG. 1a illustrates three stacked die, this is for illustration only. Likewise, the use of wire bonding is merely illustrative and other approaches for electrically connecting the stacked die are within the contemplated scope of the present disclosure.

As discussed above, top substrate 16 illustrated in FIG. 1a has contacts 12 on a first side for electrical connection to other components. Top substrate 16 has contacts 18 on a second side. Contacts 18 of top substrate 16 are coupled to connector elements 20. In the illustrated embodiment, connector elements 20 are solder balls that provide for electrical conduction of signals and power to stacked die 8. Other connection components, such as conductive bumps, conductive balls, conductive pillars, and the like could be employed as connector element 20.

As further illustrated by Figure 1a, connector elements 20 physically and electrically connect top package 2 to bottom package 4. Bottom package 4 includes die 22, which is flip chip attached to bottom substrate 26, and which is electrically connected thereto by way of connector elements 24.

Illustrated in FIG. 1a, bottom substrate 26 may be composed of a semiconductor material such as silicon, germanium or gallium arsenide. Bottom substrate 26 may have a thickness 32 of from about 30 microns to about 200 microns, causing PoP structure 1 to have a low physical profile. Through vias 28, which may be composed of copper, or may be composed of tungsten, aluminum, solder, or the like, pass through bottom substrate 26. Bottom substrate 26 has a high thermal conductivity, which might be about 110 W/mK. Through vias 28 of bottom substrate 26 are aligned with connector elements 24, which electrically and thermally connect bottom substrate 26 with die 22. Through vias 28 are also aligned with connector elements 30, which electrically and thermally connect bottom substrate 26 to printed circuit board (PCB) 6.

An advantageous feature of the illustrated package of FIG. 1a is that a thermal conduction path is provided between die 22 and PCB 6. This thermal conduction path is provided as follows. Die 22 is flip chip attached to bottom substrate 26. Heat may be conducted from die 22 to bottom substrate 26 through connector elements 24. As addressed above, bottom substrate 26 contains through vias 28, which have a high thermal conductivity. The alignment of through vias 28 with connector elements 24 and with connector elements 30 provide a thermal path from die 22 to PCB 6, where heat can be dissipated. Heat is thus conducted from die 22, through connector elements 24, across through vias 28 of bottom substrate 26, through connector elements 30 to PCB 6.

Another advantageous feature of the embodiment illustrated in FIG. 1a is a reduction in warpage induced ball cracking caused by thermal expansion mismatch. Thermal expansion mismatch between components of the package can cause warpage, which can in turn cause cracking in connector elements. In the embodiment illustrated in FIG. 1a, the thermal expansion coefficient of die 22 is similar to the thermal expansion coefficient of bottom substrate 26. The thermal expansion coefficient of bottom substrate 26 might be from about 2 parts-per-million per degree Celsius to about 6 parts-per-million per degree Celsius. The mismatch of the thermal expansion coefficient of bottom substrate 26 and the thermal expansion of coefficient of die 22 might be less than about 10 parts-per-million, or in some embodiments less than about 5 parts-per-million per degree Celsius.

A further advantageous feature of the embodiment illustrated in FIG. 1a is the low profile of PoP structure 1. Bottom substrate 26 has a thickness 32 which might be about 100 microns. Bottom package 4 has a height 34 which might be about 390 microns. PoP structure 1 has a thickness 36 which might be about 980 microns. The relatively low profile of PoP structure 1 allows for a high density of devices.

Figure 1B:
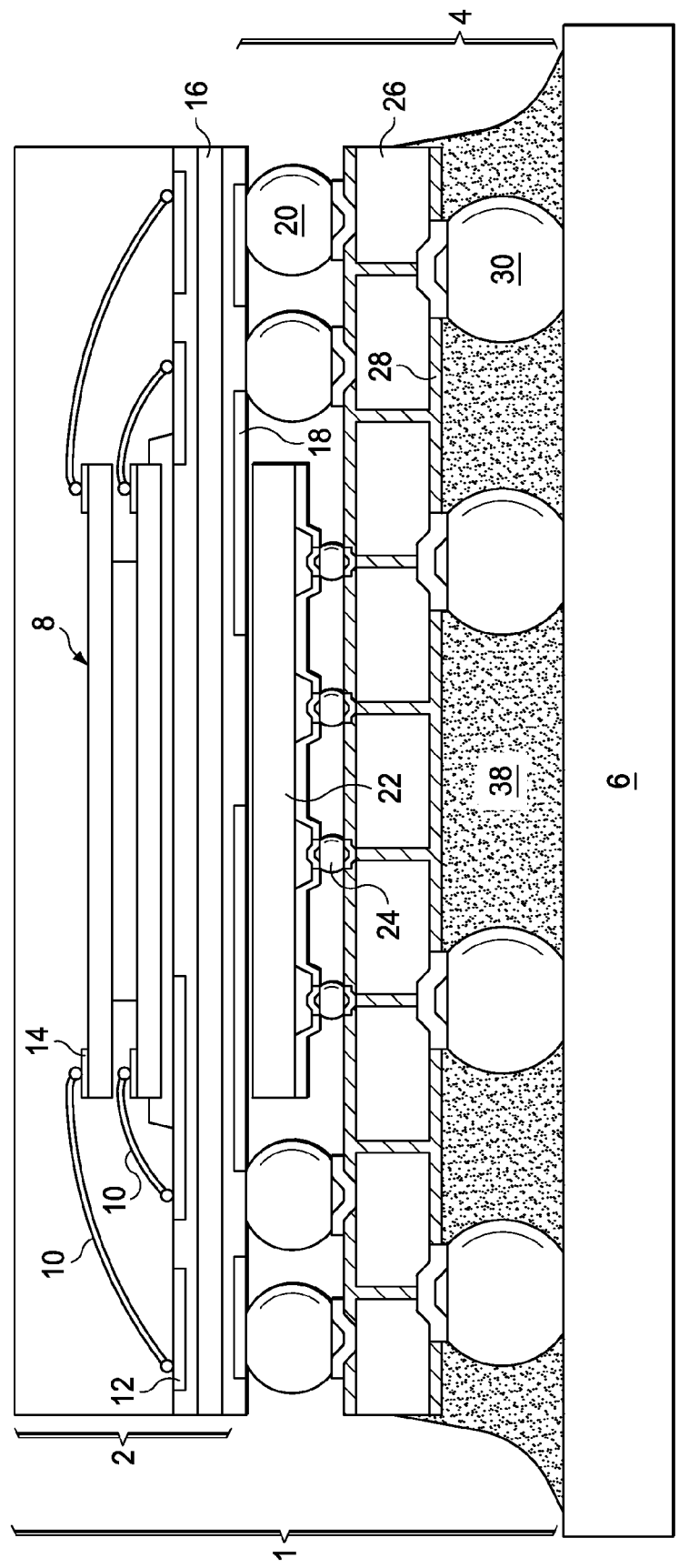

Another embodiment package is illustrated in FIG. 1b. In FIG. 1b, underfill 38 lies between bottom substrate 26 and PCB 6. Underfill 38 might be an epoxy polymer, or it might be the composite polymer with silica additives. Silica additives may enhance the mechanical strength of the polymer and/or to adjust the CTE of the polymer. Underfill 38 reinforces the strength of connector elements 30. Underfill 38 completely surrounds connector elements 30 and is contiguous with both bottom substrate 26 and PCB 6.

Figure 1C:
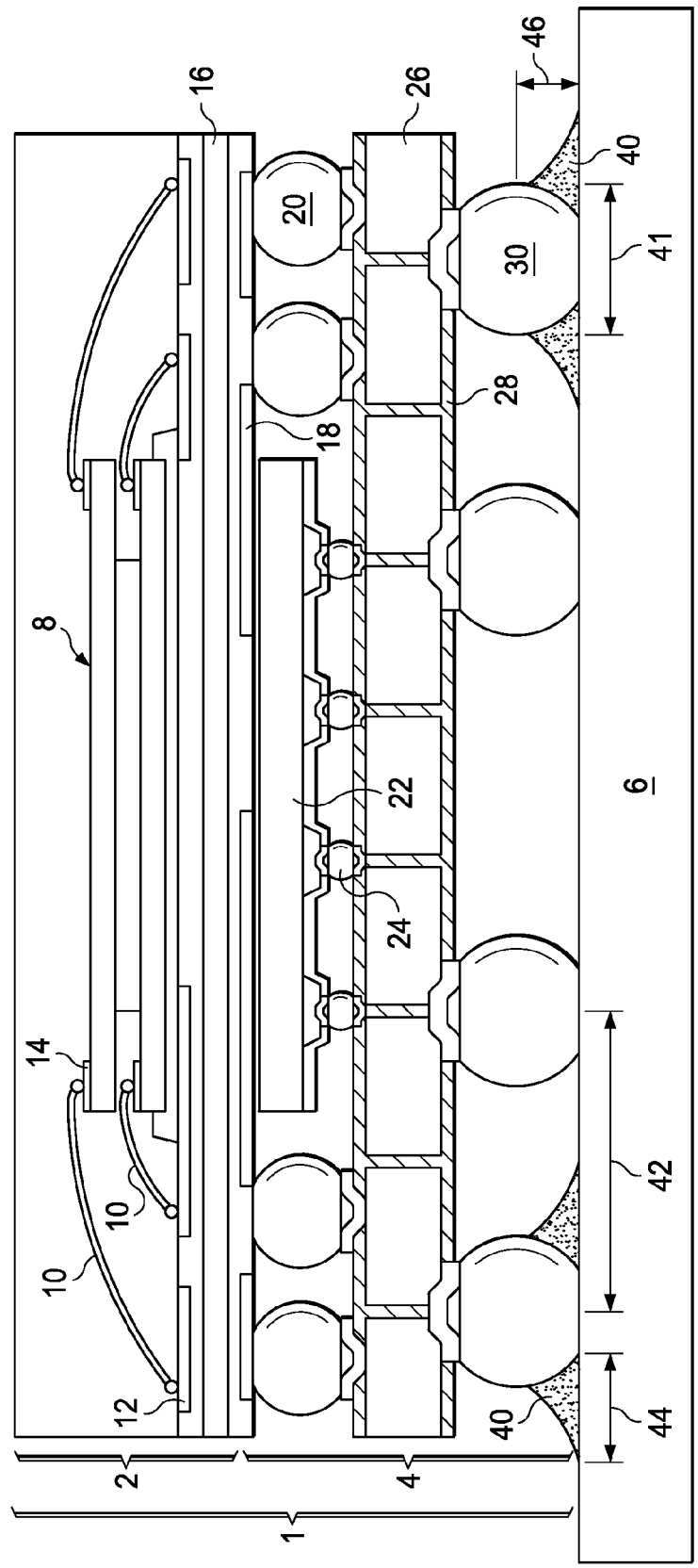

An additional embodiment package is illustrated in FIG. 1c. In FIG. 1c, underfill 40 is localized near connector elements 30 along PCB 6. Underfill 40 partially surrounds connector elements 30. Underfill 40 is contiguous with PCB 6. However, underfill 40 is not contiguous with bottom substrate 26. Underfill 40 might be an epoxy polymer. Connector elements 30 might have a diameter 41 of about 250 microns and a pitch 42 of about 400 microns. Underfill 40 might have a height 46 of about 10-50 microns and a width 44 of about 5-80 microns. Because underfill 40 might have a low thermal conductivity, the combination of connector elements 30 with underfill 40 allows the underfill 40 to reinforce the strength of the connection, while connector elements 30 maintain high thermal conductivity.

Figure 1D:
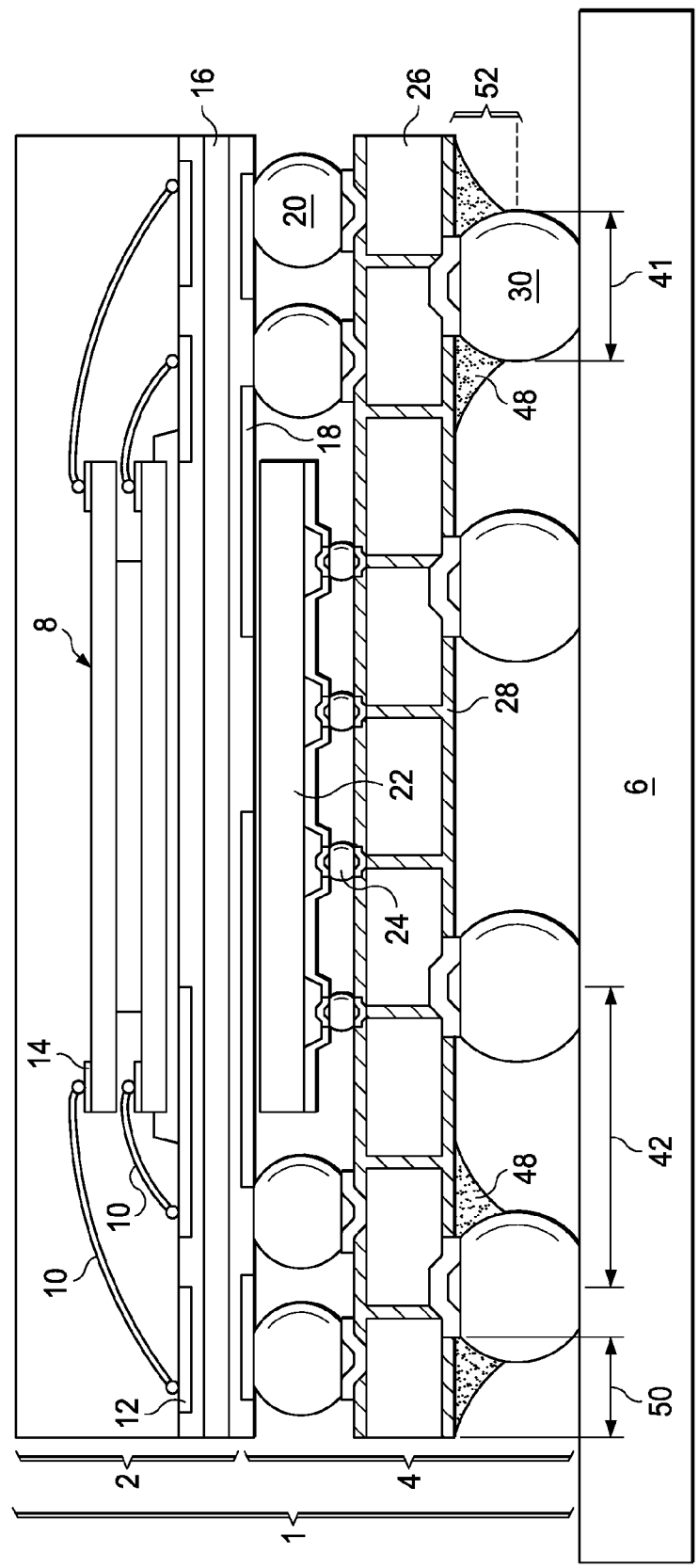

A further embodiment package is illustrated in FIG. 1d. In FIG. 1d, underfill 48 is localized near connector elements 30 along bottom substrate 26. Underfill 48 partially surrounds connector elements 30. Underfill 48 is contiguous with bottom substrate 26. However, underfill 48 is not contiguous with PCB 6. Underfill 48 might be an epoxy polymer. Connector elements 30 might have a diameter 41 of about 250 microns and a pitch 42 of about 400 microns. Underfill 48 might have a height 52 of about 10-50 microns and a width 50 of about 5-80 microns. As in the embodiment illustrated in FIG. 1c, localized underfill 48 reinforces the strength of connector elements 30 while maintains a high thermal conductivity.

In the various above-described embodiments, underfill 40 may be formed around each and every connector element 30, or around only certain selected connector elements 30. One such embodiment is illustrated in FIG. 2, wherein underfill 40 is formed around only those connector element 30 located at corners of the package. The package is illustrated from a top down perspective in FIG. 2, wherein top package 2 and underlying substrate 6 are visible. Connector element 30 and underfill 40 are beneath top package 2 and hence are illustrated in phantom line. Note that the corner regions are the regions most subject to stress, and hence underfill 40 is most beneficial for those connector elements. In other embodiments, other connector elements in other regions of the package could be selected for inclusion of underfill 40.

Figure 1E:
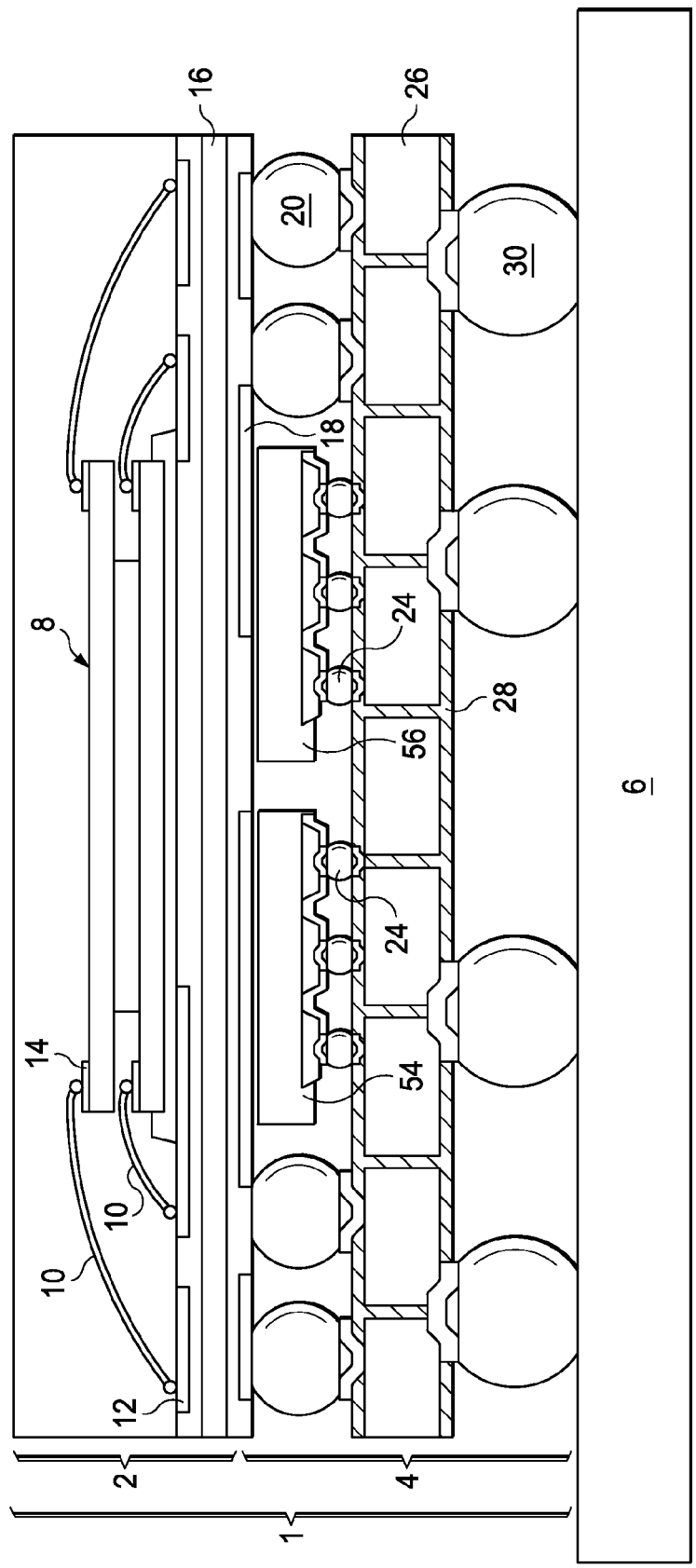

FIG. 1e illustrates an embodiment containing more than one die. Die 54 and die 56 are thermally and electrically connected to PCB 6. Each of die 54 and die 56 is flip chip attached to bottom substrate 26. Although FIG. 1e illustrates two die, this is for illustration only. Any number of die may be flip chip attached to bottom substrate 26. Heat may be conducted from die 54 and from die 56 to bottom substrate 26 through connector elements 24. As addressed above, bottom substrate 26 contains through vias 28, which have a high thermal conductivity. The alignment of connector elements 24 with through vias 28 further provides a good path for thermal conduction. Through vias 28 are aligned with connector elements 30, providing a good thermal path to PCB 6, where the heat can be dissipated. Heat is thus conducted from die 54 and from die 56 through connector elements 24, across through vias 28 of bottom substrate 26, through connector elements 30 to PCB 6.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a first package including:
      a first substrate; and
      a first integrated circuit on the first substrate;
   a second package including:
      a second substrate having a first coefficient of thermal expansion, the second substrate having conductive vias therethrough, wherein a top surface of the second substrate is substantially level; and
      a second integrated circuit having a second coefficient of thermal expansion, the second integrated circuit located on the top surface of the second substrate, wherein the second coefficient of thermal expansion deviates from the first coefficient of thermal expansion by less than 10 parts-per-million per degree Celsius;
   a first set of conductive elements coupling the first substrate and the second substrate; and
   a second set of conductive elements coupling the second substrate and the second integrated circuit.

2. The semiconductor device of claim 1 further comprising:
   a third set of conductive elements coupled to the second substrate; and
   a printed circuit board coupled to the third set of conductive elements.

3. The semiconductor device of claim 1, wherein the second substrate has a thickness of from about 30 microns to about 200 microns.

4. The semiconductor device of claim 1, wherein the second substrate has a thermal expansion coefficient of about 3 parts per million per degree Celsius to about 6 parts per million per degree Celsius.

5. The semiconductor device of claim 1, wherein the second substrate comprises silicon, wherein the conductive vias through the second substrate comprise a material selected from the group consisting of copper, tungsten, aluminum and solder.

6. The semiconductor device of claim 2, further comprising underfill surrounding at least a subset of the third set of conductive elements, the subset including conductive elements located at corners of the second substrate.

7. The semiconductor device of claim 2, further comprising underfill partially surrounding the third set of conductive elements, the underfill being not contiguous with the second substrate and contiguous with the printed circuit board, or being contiguous with the second substrate and not contiguous with the printed circuit board.

8. The semiconductor device of claim 1, wherein the second coefficient of thermal expansion deviates from the first coefficient of thermal expansion by less than 5 parts-per-million per degree Celsius.

9. A package comprising:
   a first package having a first die formed on a first substrate;
   a second package having a second die and a third die formed on a second substrate, the second substrate having a first coefficient of thermal expansion, the second substrate having conductive vias therethrough, the second die having a second coefficient of thermal expansion, wherein the second coefficient of thermal expansion deviates from the first coefficient of thermal expansion by less than 10 parts-per-million per degree Celsius, the third die having a third coefficient of thermal expansion, wherein the third coefficient of thermal expansion deviates from the first coefficient of thermal expansion by less than 10 parts-per-million per degree Celsius;
   a first set of conductive elements coupling the first substrate and the second substrate;
   a second set of conductive elements coupling the second substrate and the second die; and
   a third set of conductive elements coupling the second substrate and the third die.

10. The package of claim 9, further comprising:
a fourth set of conductive elements coupled to the second substrate; and
a printed circuit board coupled to the fourth set of conductive elements.

11. The package of claim 10, further comprising underfill surrounding at least ones of the fourth set of conductive elements that are located at corners of the second substrate.

12. The package of claim 10, further comprising underfill partially surrounding the fourth set of conductive elements, the underfill being not contiguous with the second substrate and contiguous with the printed circuit board, or being contiguous with the second substrate and not contiguous with the printed circuit board.

13. The package of claim 9, wherein the second coefficient of thermal expansion deviates from the first coefficient of thermal expansion by less than 5 parts-per-million per degree Celsius, and wherein the third coefficient of thermal expansion deviates from the first coefficient of thermal expansion by less than 10 parts-per-million per degree Celsius.

14. The package of claim 9, wherein the second substrate has a thickness of about 100 microns.

15. The package of claim 9, wherein the second die has a thermal expansion coefficient of from about 3 parts per million per degree Celsius to about 6 parts per million per degree Celsius.

16. The package of claim 9, wherein the second substrate comprises silicon, wherein the conductive vias through the second substrate comprise a material selected from the group consisting of copper, tungsten, aluminum and solder.

17. A method of forming a package comprising:
providing a first package, the first package including a first die on a first substrate;
providing a second package, the second package including a second die coupled to a second substrate by a first set of conductive elements, the second substrate having a first coefficient of thermal expansion, the second substrate having conductive vias therethrough, the second die having a second coefficient of thermal expansion, wherein the second coefficient of thermal expansion deviates from the first coefficient of thermal expansion by less than 5 parts-per-million per degree Celsius, wherein a top surface of the second substrate is substantially level; and
coupling the first package and the second package with a second set of conductive elements.

18. The method of claim 17, further comprising:
forming thermal vias in the second substrate; and
aligning the thermal vias in the second substrate with the first set of conductive elements and thermally coupling the second die and the second substrate with the first set of conductive elements.

19. The method of claim 17, further comprising attaching a printed circuit board to the second substrate with a third set of conductive elements.

20. The method of claim 19, further comprising inserting underfill between the second substrate and the printed circuit board, the underfill being adjacent to the third set of conductive elements.

* * * * *